(12) United States Patent  
Wolfarth et al.

(10) Patent No.: US 9,419,523 B2
(45) Date of Patent: Aug. 16, 2016

(54) METHOD FOR IDENTIFYING A SHORT-LINE FAULT OR A LINE INTERRUPTION FOR A SWITCHED INDUCTIVE LOAD

(71) Applicant: CONTINENTAL AUTOMOTIVE GMBH, Hannover (DE)

(72) Inventors: Gunther Wolfarth, Regensburg-Harting (DE); Harald Schmauss, Donaustauf (DE)

(73) Assignee: Continental Automotive GmbH, Hannover (DE)

( * ) Notice: Subject to any disclaimer, the term of this patent is extended or adjusted under 35 U.S.C. 154(b) by 127 days.

(21) Appl. No.: 14/513,390

(22) Filed: Oct. 14, 2014

(65) Prior Publication Data

US 2015/0102790 A1    Apr. 16, 2015

(30) Foreign Application Priority Data

Oct. 14, 2013 (DE) .......................... 10 2013 220 705
Feb. 11, 2014 (DE) .......................... 10 2014 202 460

(51) Int. Cl.
*H02M 3/158* (2006.01)
*G01R 31/02* (2006.01)
*G01R 31/06* (2006.01)

(52) U.S. Cl.
CPC .............. *H02M 3/158* (2013.01); *G01R 31/024* (2013.01); *G01R 31/06* (2013.01)

(58) Field of Classification Search
CPC .... G01R 31/024; G01R 31/06; G01R 31/025; G01R 31/026; H02H 3/06; H02M 2001/0009; H02M 3/158
See application file for complete search history.

(56) References Cited

U.S. PATENT DOCUMENTS 4,932,246 A * 6/1990 Deutsch ............... G01R 31/007
                                                    73/114.45
5,138,515 A * 8/1992 Bourgeois ............ H03K 17/691
                                                       323/289

(Continued)

FOREIGN PATENT DOCUMENTS

DE     102008035325 A1   3/2009
EP         0059774 B1    6/1986

*Primary Examiner* — Adolf Berhane
*Assistant Examiner* — Henry Lee, III
(74) *Attorney, Agent, or Firm* — Laurence A. Greenberg; Werner H. Stemer; Ralph E. Locher

(57) ABSTRACT

A method identifies a short-line fault or line interruption in a circuit configuration having a series circuit of inductive load and controllable switching element. The series circuit is connected between high and low potentials of a supply voltage source. A connecting point between load and switching element is connected through at least one zener element to the high or low potential of the voltage source or the control connection of the switching element so that upon interruption of current flow through the load due to switching off the switching element, magnetic energy stored in the load can be reduced by a zener element becoming conductive. After switching off the switching element, the voltage at the connecting point is ascertained and a voltage pulse duration is compared with a first prescribed duration. If the duration is shorter than the first prescribed duration, a line interruption or a short is inferred.

3 Claims, 2 Drawing Sheets

(56) References Cited

U.S. PATENT DOCUMENTS

| | | | | |
|---|---|---|---|---|
| 5,304,935 A | * | 4/1994 | Rathke | G01R 31/024 324/415 |
| 5,977,743 A | * | 11/1999 | Flock | H03K 17/063 318/139 |
| 7,812,590 B2 | | 10/2010 | Kaltenegger et al. | |
| 2009/0072809 A1 | * | 3/2009 | Kaltenegger | G01R 31/024 324/76.11 |
| 2009/0309607 A1 | * | 12/2009 | Arndt | G01R 31/024 324/522 |

* cited by examiner

METHOD FOR IDENTIFYING A SHORT-LINE FAULT OR A LINE INTERRUPTION FOR A SWITCHED INDUCTIVE LOAD

CROSS-REFERENCE TO RELATED APPLICATION

This application claims the priority, under 35 U.S.C. §119, of German Patent Application DE 10 2013 220 705.0 filed Oct. 14, 2013 and German Patent Application DE 10 2014 202 460.9 filed Feb. 11, 2014; the prior applications are herewith incorporated by reference in their entirety.

BACKGROUND OF THE INVENTION

Field of the Invention

The invention relates to a method for identifying a short-line fault or a line interruption for a switched inductive load.

Modern engine controllers have a multiplicity of electronic switching elements, possibly implemented in ASICs, in the form, for example, of power MOSFETs or IGBTs or other transistors to which external loads such as valve coils, for example, for fuel injectors can be connected in order to be able to switch them on and off. Those loads are usually connected to the engine controller through lines that are laid in the wiring harness of the vehicle.

Such a load connected to an engine controller and the connecting lines between the load and the engine controller need to be able to undergo diagnosis. An interruption in the load connection or a short between the load connection and supply voltage potential or ground, inter alia, needs to be identified by the engine controller. In a half-bridge configuration, in which the inductive load is operated between a high-side switch and a low-side switch, it may also be necessary to detect whether the short between the load connection and supply voltage potential has occurred on the high-side connection or the low-side connection to the load.

In order to identify an existing connection between the load and the engine controller, it is possible for current measurement to be performed in the switched-on state of the load, for example, with no current or an excessively small current indicating an interruption in the connecting line. In addition or as an alternative, in the switched-off state of the load, a diagnosis current can be fed to the connecting point between the load and the switching element. In the event of a line interruption, the diagnosis current sets a voltage level that is different than the potentials of the supply voltage source and that can be detected.

The ascertainment of a short to the supply voltage potential according to the prior art will be demonstrated by using the example of a so-called half-bridge topology. A load that is disposed between a high-side switch and a low-side switch would, in the disconnected state, in which both switches are switched off, be undefined in terms of voltage. The voltage across the load would be determined by leakage currents. Therefore, typically in the off state, diagnosis circuitry that has a high impedance in comparison with the load impedance is used to impress a diagnosis current that sets, across the load, a voltage that differs from the supply voltage potential and the ground potential. In the fault-free state, in the switched-off state, a voltage that corresponds to the difference between the supply voltage potential and the diagnosis voltage will appear across the high-side switch and a voltage that corresponds to the diagnosis voltage will appear on the low-side switch.

In the disconnected state, a short to the supply voltage potential both on the high-side load connection and on the low-side load connection will raise the voltage of both connecting lines to the supply voltage potential. Hence, the voltage across the high-side switch will then be 0 volts and the voltage across the low-side switch will be the same as the supply voltage potential.

That change in the voltages on the switches can be used to infer a short to the supply voltage potential. However, the position of the short, whether on the high-side connecting line or on the low-side connecting line, cannot be ascertained in that manner.

In a half-bridge configuration in which the load current is regulated or controlled by the high-side switch, a short to supply voltage potential will, given sufficiently long load actuation, result in an overcurrent condition in the low-side switch. That will normally result in protective disconnection of the output stage. The occurrence of the overcurrent in the low-side switch can be used as an indication of a short to supply voltage potential. However, the position of the short, whether on the high-side connecting line or the low-side connecting line, cannot be ascertained in that manner, since both possibilities would result in a low-side overcurrent.

A solution to the problem of ascertaining the precise position of the short to supply voltage potential, according to the prior art, involves ascertaining the speed of the current rise in the low-side path. A short to supply voltage potential on the high-side connecting line would result in a current rise that is slowed by the inductive load, whereas a short on the low-side connecting line would bring about a fast current rise, since the latter is slowed only by a small short-circuit inductance. It is thus possible to ascertain the position of the short by ascertaining the speed of the current rise. However, that requires a complex diagnosis circuit.

When inductive loads are disconnected and there is no freewheeling circuit in parallel with the load, the voltage across the load rises beyond the supply voltage. That voltage rise is limited by load voltage zenering, which firstly necessitates a fast load current drop and secondly protects the connected electronic components against overvoltage. The temporal length of that load voltage zenering pulse is substantially dependent on the inductance, on the zener voltage of a zener element and on the current amplitude at the disconnection instant.

German Patent Application DE 10 2008 035 325 A1, corresponding to U.S. Pat. No. 7,812,590, describes a method for detecting the presence of a load between connecting terminals in which a supply voltage is cyclically applied to the connecting terminals during switched-on periods, an electrical potential on one of the connecting terminals is evaluated during at least one evaluation instant, the timing of which is after one of the switched-on periods, and a load interruption signal is produced that is dependent on whether the electrical potential on the connecting terminal at the evaluation instant differs from a potential on the connecting terminal when the supply voltage is applied by more than a prescribed comparison value. As active zenering, in an exemplary embodiment, the gate of a low-side switch that is connected in series with an inductive load between the connecting terminals of a supply voltage source is connected in that case to the connecting point between the inductive load and the low-side switch through a forward-biased first zener diode, optionally with a reverse-biased second zener diode being able to be disposed between the control connection of the low-side switch and the ground potential. However, the disclosure therein does not require a short to be detected.

European Patent EP 0 059 774 B1 describes a method for monitoring inductive DC voltage loads in which the operation of the equipment, of the switching elements and the wiring configuration are checked. In that case, a load and an amplifier are connected in series between a positive and a negative pole of a network. The positive pole and the connecting point between the amplifier and the load have a diode and a zener diode connected between them. If the amplifier is switched off by removing the control voltage, the load discharges through the zener diode. The resultant signal voltage is tapped off through a resistor and is evaluated in terms of the pulse length of a voltage spike in a microcomputer, taking prescribed comparison values into account, in order to identify disturbances.

SUMMARY OF THE INVENTION

It is accordingly an object of the invention to provide a method for identifying a short-line fault or a line interruption for a switched inductive load, which overcomes the hereinafore-mentioned disadvantages of the heretofore-known methods of this general type and which, given active or passive zenering of the induced voltage brought about by the disconnection of an inductive load, allows simple detection of a line interruption or of the existing load connection and/or of a short between the connections of the inductive load and the supply potential or ground.

With the foregoing and other objects in view there is provided, in accordance with the invention, a method for identifying a short-line fault or a line interruption in a circuit configuration having a series circuit including an inductive load, a first controllable switching element and a second controllable switching element. The series circuit is connected between high and low potentials of a supply voltage source. The inductive load has a first connection connected to the high potential of the supply voltage source through the first switching element and a second connection connected to the low potential of the supply voltage source through the second switching element. The connecting point between the inductive load and the first switching element is connected through at least one zener diode either to the high or to the low potential of the supply voltage source or to the control connection of the first switching element in such a way that in the event of the flow of current through the inductive load being interrupted due to the first controllable switching element being switched off, the magnetic energy stored in the inductive load can be reduced through a zener diode that becomes conductive. After the first switching element has been switched off, the voltage at the connecting point between the inductive load and the first switching element is ascertained and the duration of the voltage pulse occurring is compared with a first prescribed duration and, if the duration is shorter than the first prescribed duration, a line interruption or a short is inferred, but a line interruption is inferred only if no overcurrent condition has occurred.

The inventive detection of this load voltage zenering pulse with a minimum length that is to be expected is used to draw a conclusion as to an existing connection to the inductive load. Absence of the expected zener pulse is an indication of a faulty connection to the load. A minimum length of the zener pulse during identification is necessary because even short-circuit connections have an inductance that can produce a zener pulse. The latter is of relatively short duration in comparison with normal load zenering, however, since the short-circuit inductance and the load inductance differ.

The concept of identification of the connected load by using a load zenering pulse can be applied for different circuit topologies. A first possibility is the use of just one low-side switch, in the case of which one connection of an inductive load is connected directly to the high supply voltage potential, with the second connection of the load being connected through a switch to the low supply voltage potential, which interrupts the load current. The rise in the voltage driven by the load inductance takes place on the load-side connection of the switch.

A second possibility is a so-called half-bridge circuit, in which the load is situated between two switches. A high-side switch connects or isolates the load from the high potential of the supply voltage, and a second, low-side switch connects or isolates the load from the low potential of the supply voltage or ground potential.

In accordance with another mode of the invention, in the case of a circuit topology as defined above, a short between the first connection of the inductive load and the high potential of the supply voltage source can be inferred if an overcurrent condition has occurred and, after the second switching element has been switched off, the duration of a voltage pulse occurring is longer than the first prescribed duration.

In accordance with a further mode of the invention, a short between a second connection of the inductive load and the high potential of the supply voltage source can be inferred if an overcurrent condition has occurred and, after the second switching element has been switched off, the duration of a voltage pulse occurring is shorter than a second prescribed duration, which is shorter than the first prescribed duration.

When an overcurrent condition is identified in the low-side load path, which implies a short to the high supply voltage potential, it is possible for the position of the short, whether on the high-side connecting line or on the low-side connecting line, to be ascertained by the occurrence of a load voltage zener pulse, the distinction being made on the basis of the duration of the zener pulses, since, depending on whether the short occurs on the high side or the low side of the inductive load, a longer zener pulse will occur due to the current that still flows in the inductive load in the event of a short on the high side thereof.

In accordance with a concomitant mode of the invention, since even short-circuit lines themselves have an inductance, it is further possible for a short through the inductive load to be inferred if an overcurrent condition has occurred and, after the first or second switching element has been switched off, the duration of a voltage pulse occurring is longer than the second prescribed duration and shorter than a third prescribed duration, which is longer than the second prescribed duration and shorter than the first prescribed duration.

Although the inductive load is shorted in this case, so that a zener pulse occurring will be shorter than when an inductive load is present, the inductance of the short-circuit current path means that the zener pulse will be longer than in the event of a short between the low-side connection of the inductive load and the high supply voltage potential.

In a manner according to the invention, it is thus possible for a line interruption, a short between the high-side connection of an inductive load and the high supply potential, a short between the low-side connection of an inductive load and the high supply potential and a short through the inductive load, to be distinguished by measuring the zener pulse occurring when the inductive load is disconnected and comparing the duration of the zener pulse with prescribed characteristic pulse durations.

Other features which are considered as characteristic for the invention are set forth in the appended claims.

Although the invention is illustrated and described herein as embodied in a method for identifying a short-line fault or a line interruption for a switched inductive load, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
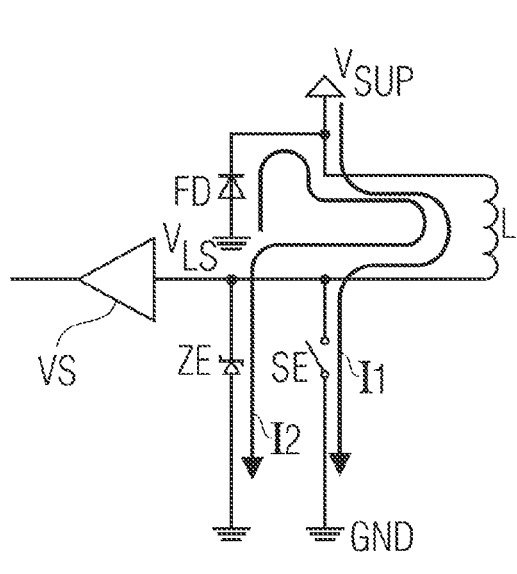
FIG. 1 is a schematic circuit diagram of a configuration with an inductive load and a low-side switch having a freewheeling path through a zener diode according to the prior art.

Referring now to the figures of the drawings in detail and first, particularly, to FIG. 1 thereof, there is seen a first circuit topology for switching an inductive load L on and off using a first switching element SE, which may be in the form of a power MOSFET or in the form of an IGBT or in the form of another transistor, for example. In this case, the inductive load L and the first switching element SE are connected in series between a high potential $V_{SUP}$ and a low potential GND of a supply voltage source, which is not shown in detail.

When the first controllable switching element SE is switched on due to an appropriate control signal from a control circuit, which may be formed by a microprocessor, for example, a current I1 flows from the high potential $V_{SUP}$ through the inductive load L and the switching element SE to the low potential GND of the supply voltage source. This operates the inductive load L, for example switches on a solenoid valve.

Actuating the first switching element SE to switch it off interrupts the current I1, which induces in the inductive load L a voltage that would sometimes result in destruction of the first switching element SE. In order to prevent this, a zener element ZE is connected in the reverse direction between a connecting point between the inductive load L and the first switching element SE and the low potential GND of the supply voltage source. By way of example, the zener element ZE may be in the form of a suppressor diode or in the form of a zener diode. As an alternative to passive zenering, as shown in FIG. 1, it is also possible for the anode connection of the zener element ZE to be connected to the control connection of the first switching element SE, for example the gate connection of a power MOSFET or of an IGBT, in order to prompt the first switching element SE to be switched on again when there is a particular voltage on the cathode of the zener element ZE.

In addition, a freewheeling diode FD is also disposed between the supply-potential-side connection of the inductive load L and the low potential of the supply voltage GND in FIG. 1. This results in a flow of current I2 through the freewheeling diode FD, the inductive load L and the zener element ZE when the voltage on the cathode of the zener element ZE reaches the prescribed zener voltage, as a result of which the magnetic energy stored in the inductive load L can be quickly reduced.

Figure 4A:
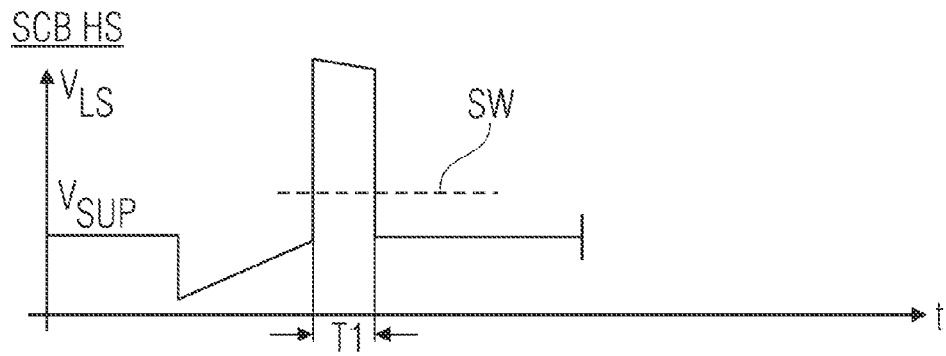
FIGS. 4A to 4C show zener pulse durations for corresponding faults.

The profile of the voltage $V_{LS}$ at the connecting point between the inductive load L and the first switching element SE is shown in FIG. 4A. This figure reveals that, in the disconnected state of the first switching element SE, this voltage $V_{LS}$ assumes the value of the high supply voltage potential $V_{SUP}$. When the first switching element SE is operated to switch it on at a particular instant, the voltage $V_{LS}$ will assume a value close to the low potential GND of the supply voltage source, the voltage difference resulting from the forward voltage of the first switching element SE.

Due to the increasing current through the inductive load L and the first switching element SE, the voltage $V_{LS}$ will rise up to the instant at which the first switching element SE is switched off, at which the current I1 is interrupted and as a result the voltage $V_{LS}$ rises very fast. Due to the magnitude of the current I1 that has previously flowed through the inductive load L, the magnitude of the inductance and of the resistance of the inductive load L and the magnitude of the high supply voltage potential $V_{SUP}$, a corresponding time will elapse before the magnetic energy stored in the inductive load L is reduced, and the current I2 comes to a standstill, as a result of which the positive supply voltage potential $V_{SUP}$ appears again on the low-side connection of the inductive load L for the voltage $V_{LS}$ thereon.

Figure 2:
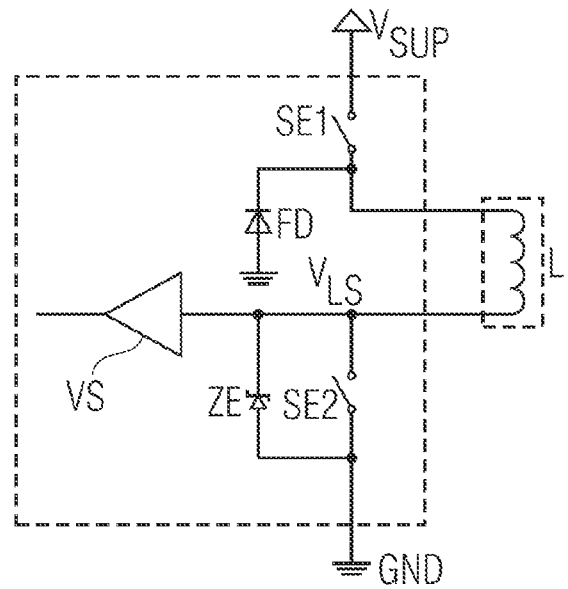
FIG. 2 is a circuit diagram showing an inductive load in a half-bridge topology with a passive zener circuit according to the prior art.

The same situation arises for a further circuit topology as shown in FIG. 2, which is usually referred to as a half-bridge topology. In this case, the inductive load L has its first connection connected to the high supply voltage potential $V_{SUP}$ through a first controllable element SE1 and has its second connection connected to the low supply voltage potential GND of a supply voltage source through a second controllable switching element SE2. Usually, in the case of such a half-bridge topology, the inductive load L is connected to the ground potential GND by the second controllable switching element SE2 while periodic switching-on and switching-off of the first controllable switching element SE1 regulates the current through the inductive load L to a particular value.

In the same way as in the case of the circuit topology shown in FIG. 1, a zener element ZE and a freewheeling diode FD are connected in this case too.

The low-side second connection of the inductive load L, from which the voltage $V_{LS}$ can be tapped off, is connected to the input of an amplifier circuit VS, the output of which leads to a non-illustrated evaluation circuit, that can be implemented by the control circuit, for example.

Figure 3:
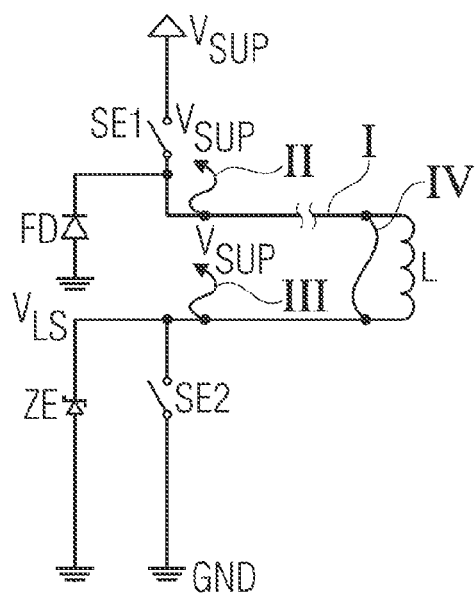
FIG. 3 is a circuit diagram showing a half-bridge topology with faults shown.

Finally, FIG. 3 shows the possible fault states for a circuit topology as shown in FIG. 2. In this case, I represents a line interruption, II represents a short between the high-side connection of the inductive load L and the high supply voltage potential $V_{SUP}$, III represents a short between the low-side second connection of the inductive load L and the high supply voltage potential $V_{SUP}$ and IV represents a short through the inductive load L.

In the first case I to be considered, the zener pulse shown in FIG. 4A, which has a relatively long duration, would disappear completely in the event of a line interruption, since the line interruption means that no current can flow through the inductive load L and therefore no magnetic energy can be stored in the inductive load L that could result in an induced voltage $V_{LS}$ upon disconnection.

In a manner according to the invention, the duration of the zener pulse, as shown in FIG. 4A, is now evaluated by comparing firstly this voltage $V_{LS}$ with a threshold value SE and secondly the duration of the zener pulse with a first prescribed duration T1. If the duration of the zener pulse is shorter than the first prescribed duration T1 and no overcurrent condition has been identified, a line interruption is inferred in a manner according to the invention.

However, should there be a short between one of the connections of the inductive load L and the high supply potential $V_{SUP}$ in the case of a half-bridge topology as shown in FIGS. 2 and 3, an overcurrent condition would be identified after an appropriate time and the circuit would be deactivated. The then resultant durations of the zener pulses on the cathode of the zener element ZE differ significantly in terms of duration. In the case of a short between the first, high-side connection of the inductive load L and the high supply voltage potential $V_{SUP}$, a voltage profile as shown in FIG. 4A would be obtained that corresponds to that of an intact line, but additionally requires the overcurrent condition for short-circuit identification.

Figure 4B:
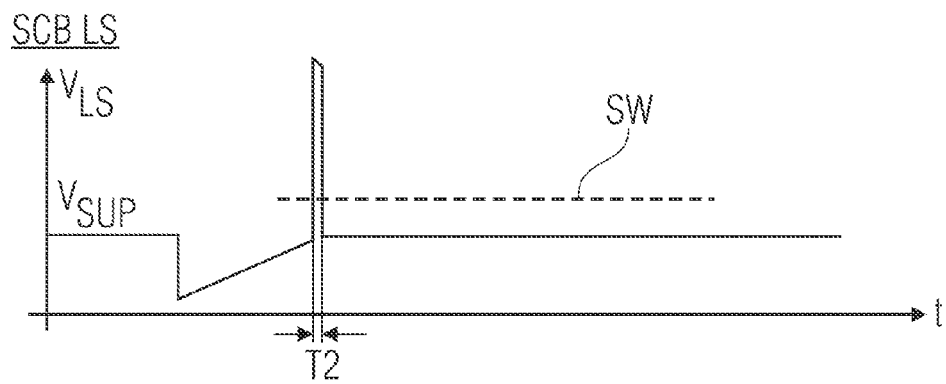

However, if there is a short between the second, low-side connection of the inductive load L and the high supply voltage potential $V_{SUP}$, only the magnetic energy stored in the short-circuit line needs to be reduced, which results in the very short pulse in FIG. 4B. These two significantly different pulse durations can now easily be identified by comparing the pulse duration for an overcurrent condition that has arisen firstly with a first prescribed duration T1 and secondly with a second prescribed duration T2 and inferring a high-side short in the event of the first prescribed duration T1 being exceeded and a low-side short in the event of a pulse duration that is shorter than the second prescribed duration T2.

Figure 4C:
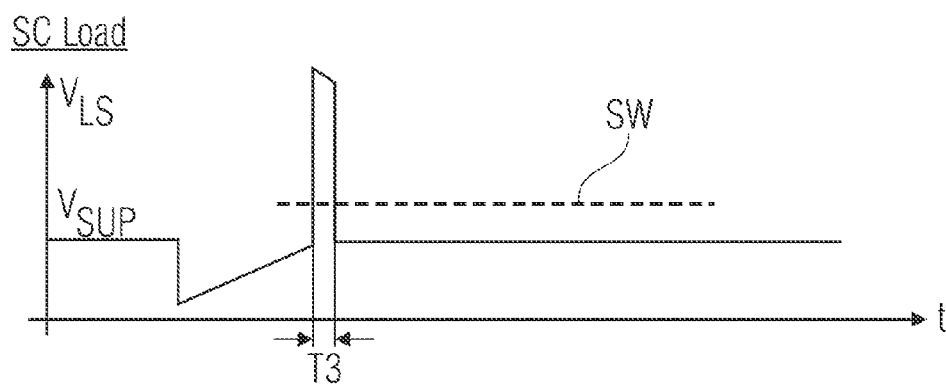

If there is a short through the inductive load L, as denoted by IV in FIG. 3, the inductance of the short-circuit line through the inductive load L will also be added in addition to the inductance of the connecting lines, which means that the pulse will be somewhat larger than in the case of a low-side short to the positive supply voltage potential $V_{SUP}$ and the pulse will be of correspondingly longer duration. Suitable selection of both the second prescribed duration T2 and a third prescribed duration T3, which is longer than the second prescribed duration T2 and shorter than the first prescribed duration T1, allows such a short through the inductive load L to be detected when the measured duration of the zener pulse shown in FIG. 4C is shorter than the third prescribed duration T3 and longer than the second prescribed duration T2.

A fundamental feature of the method according to the invention is that acknowledgements necessitated by the circuit topology are used to be able to detect a line interruption and/or the position of shorts to the high or to the low supply voltage potential. Only the quantitative evaluation of the presence of a zener voltage pulse is necessary. Measurement with high temporal resolution and measurement accuracy can therefore be dispensed with. This is of particular benefit when no load current measurement is provided that could be used to infer the short-circuit position through evaluation of the current amplitude and current rise time. Measurement of the pulse length with more accurate temporal resolution is necessary exclusively in order to distinguish a short to the positive supply voltage potential on the low-side connecting line of the inductive load from a short through the load.

The invention claimed is:

1. A method for identifying a short-line fault or a line interruption in a circuit configuration, the method comprising the following steps:
   providing a supply voltage source having high and low potentials;
   providing a series circuit connected between the high and low potentials of the supply voltage source, the series circuit having an inductive load, a first controllable switching element with a control connection and a second controllable switching element;
   providing the inductive load with a first connection connected to the high potential of the supply voltage source through the first switching element and a second connection connected to the low potential of the supply voltage source through the second switching element;
   providing a connecting point between the inductive load and the second switching element;
   providing at least one zener element connected between the connecting point and the high or low potential of the supply voltage source or the control connection of the first switching element, permitting magnetic energy stored in the inductive load to be reduced by the zener element becoming conductive in the event of an interruption of a flow of current through the inductive load due to the first controllable switching element being switched off;
   after the first switching element has been switched off, ascertaining a voltage at the connecting point and comparing a duration of a voltage pulse occurring to a first prescribed duration and, if the duration is shorter than the first prescribed duration, inferring a line interruption or a short, and inferring a line interruption only if no overcurrent condition has occurred; and which further comprises inferring a short through the inductive load if an overcurrent condition has occurred and, after the first or second switching element has been switched off, a duration of a voltage pulse occurring is longer than the second prescribed duration and shorter than a third prescribed duration, which is longer than the second prescribed duration and shorter than the first prescribed duration.

2. The method according to claim 1, which further comprises inferring a short between the first connection of the inductive load and the high potential of the supply voltage source if an overcurrent condition has occurred and, after the second switching element has been switched off, a duration of a voltage pulse occurring is longer than the first prescribed duration.

3. The method according to claim 1, which further comprises inferring a short between the second connection of the inductive load and the high potential of the supply voltage source if an overcurrent condition has occurred and, after the second switching element has been switched off, a duration of a voltage pulse occurring is shorter than a second prescribed duration, which is shorter than the first prescribed duration.

* * * * *